(12) United States Patent
Stern

(10) Patent No.: US 8,320,423 B2
(45) Date of Patent: Nov. 27, 2012

(54) COMPACT, ALL SOLID-STATE, AVALANCHE PHOTODIODE EMITTER-DETECTOR PIXEL WITH ELECTRONICALLY SELECTABLE, PASSIVE OR ACTIVE DETECTION MODE, FOR LARGE-SCALE, HIGH RESOLUTION, IMAGING FOCAL PLANE ARRAYS

(76) Inventor: Alvin Gabriel Stern, Newton, MA (US)

( * ) Notice: Subject to any disclaimer, the term of this patent is extended or adjusted under 35 U.S.C. 154(b) by 140 days.

(21) Appl. No.: 12/806,904

(22) Filed: Aug. 24, 2010

(65) Prior Publication Data

US 2012/0051383 A1 Mar. 1, 2012

(51) Int. Cl.
*H01S 5/00* (2006.01)
(52) U.S. Cl. .................................. 372/50.21
(58) Field of Classification Search ............... 250/370.1; 257/186, E27.132; 356/4.01
See application file for complete search history.

(56) References Cited

U.S. PATENT DOCUMENTS

| | | | | |
|---|---|---|---|---|
| 5,892,575 A | * | 4/1999 | Marino | 356/5.01 |
| 6,864,965 B2 | * | 3/2005 | DeFlumere | 356/4.01 |
| 2007/0012948 A1 | * | 1/2007 | Dries et al. | 257/186 |

* cited by examiner

*Primary Examiner* — Yuanda Zhang
*Assistant Examiner* — Tuan Nguyen

(57) ABSTRACT

An advanced, back-illuminated, silicon avalanche photodiode (APD) design is presented using silicon-on-sapphire with a novel crystalline aluminum nitride (AlN) antireflective layer between the silicon and R-plane sapphire. The substrate supports optical and electrical integration of a high quantum efficiency silicon APD with a gallium nitride (GaN)-VCSEL diode in each pixel to form a novel, compact, emitter-detector pixel for passive and active 2-D and 3-D high resolution, imaging focal plane arrays. Silicon mesa pixels are anisotropically etched with a central inverted mesa frustum cavity. The APD detector is fabricated in the silicon mesa and the GaN-VCSEL diode is grown epitaxially in the center of the mesa. A sapphire microlens below each pixel collimates the VCSEL beam and focuses optical returns into the APD detector. APDs share a common front-side anode, and VCSELs share a common cathode. The APD cathode is electrically connected to the VCSEL diode anode in each emitter-detector pixel.

9 Claims, 12 Drawing Sheets

COMPACT, ALL SOLID-STATE, AVALANCHE PHOTODIODE EMITTER-DETECTOR PIXEL WITH ELECTRONICALLY SELECTABLE, PASSIVE OR ACTIVE DETECTION MODE, FOR LARGE-SCALE, HIGH RESOLUTION, IMAGING FOCAL PLANE ARRAYS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

For the purposes of imaging a scene, at low ambient illumination levels using a focal plane array comprised of solid-state detector devices, it is beneficial for the individual detectors in the array to be sensitive to light over a broad wavelength range and at single photon intensity levels. It would also be ideal if the focal plane array pixels were capable of providing their own source of short pulse, laser illumination to the area in the scene that is conjugated (using a camera lens for example) back to the respective pixel, providing the laser light pulse. Such an ideal solution would allow the solid-state detector pixels of the focal plane array to operate either in a conventional passive mode, collecting 2-D intensity images of a scene and also in an active mode, collecting 2-D or 3-D range images by detecting the time-of-flight of the optical returns reflected from objects in a scene that were illuminated by the short laser pulses generated by the pixels. The result is a highly compact, monolithic, all solid-state, focal plane array imager that supports functionality of a conventional, high resolution 2-D camera, as well as the functionality of a far less conventional, high resolution, 3-D camera, all on a single integrated circuit.

The present invention describes a method for implementing a compact, micrometer size, all solid-state emitter-detector pixel for large scale and high resolution, passive and active imaging focal plane arrays. The emitter-detector pixel consists of a silicon avalanche photodiode (APD) detector, electrically and optically integrated with a gallium nitride (GaN)/indium gallium nitride (InGaN) vertical-cavity surface-emitting laser (VCSEL) diode. The emitter-detector pixel is therefore capable of providing short pulse laser illumination at the pixel level, to the area in a scene, spatially conjugated (using a camera lens for example) back to the pixel providing the short pulse laser illumination. This method enables a compact, high resolution camera system, capable of passive, and efficient active mode imaging.

In the relatively recent past, it has become possible to fabricate solid-state arrays of silicon avalanche photodiodes optimized to operate either in linear mode or in non-linear Geiger-mode and capable of providing single photon sensitivity over a wavelength range from ultraviolet (UV) to near infrared (NIR). Focal plane arrays comprised of such linear or Geiger-mode silicon APD pixels, however, could only detect light with high sensitivity and were not in turn able to provide their own short pulse laser illumination at the pixel level, to an area in the scene spatially conjugated (using a camera lens for example) back to the respective pixel providing the illumination. To date, no effective technology is available to allow the optical and electrical integration of a solid-state, laser light emitter with a linear or Geiger-mode avalanche photodiode at the micrometer dimensions required for high resolution, passive or active imaging solid-state focal plane arrays.

As illustrated in U.S. Pat. No. 7,271,376 the silicon avalanche photodiode is designed as a pure detecting element and does not provide a means for generation of short pulse laser light for illuminating a scene.

As illustrated in U.S. Pat. No. 7,268,399 a method is described for forming semiconductor avalanche photodiodes in silicon using a plurality of doped, opposing trenches in the top and bottom surfaces of the substrate wafer. The detection device described in the invention makes no provision for integrating a solid-state laser with the radiation detecting elements.

As illustrated in U.S. Pat. No. 6,864,965, the imaging focal plane array supports dual-mode operation in both passive and active detection modes using LADAR pulses for the active mode. Switching between detection modes is accomplished by increasing the voltage bias across the detector so as to increase the gain and therefore sensitivity to the active laser pulse returns from objects in a scene. The detector pixels in the focal plane array, however, do not contain a solid-state laser light source at the pixel level, for purpose of illuminating the area in the scene that is spatially conjugated (using a camera lens for example) back to the illuminating pixel, in active detection mode.

In another embodiment of a position sensitive solid-state detector with internal gain, U.S. Pat. No. 6,781,133 B2, the invention describes a detection device and signal readout scheme, yet no provision is made for a solid-state laser light emitter to be integrated with the detector device, that would support the high resolution, active imaging function.

In another embodiment, U.S. Pat. No. 5,892,575, a method and apparatus for imaging a scene are described for resolving the 3-D spatial structure in the scene. The light source emits pulses of laser light toward the object being imaged and the detector system includes an optical system and an array of light detectors operating in non-linear Geiger-mode. The optical system collects a portion of the light scattered off of objects in the scene and directs the collected light toward the array of light detectors. The invention refers to a monolithic array of light detectors operating in the non-linear Geiger-mode and does not describe a method for an all solid-state, monolithic detector array that combines light detectors with solid-state laser light emitters at the micrometer scale, pixel level.

In another embodiment, U.S. Pat. No. 5,757,057, a method for fabricating a large array of avalanche photodiodes using a plurality of pixel contacts that are isolated by one or more isolation structures is revealed. The avalanche photodiode pixels, however, do not contain a monolithically integrated solid-state laser light emitter.

In another embodiment, U.S. Pat. No. 5,438,217, a planar avalanche photodiode device array is realized using a planar block of n-type semiconductor having a plurality of p-type wells in the block surrounded by a foundation of n-type semiconductor material. The individual solid-state detector elements of the array do not have an integrated solid-state laser light emitter.

Note that the above solid-state, semiconductor, avalanche detectors do not envision, nor describe a method for realizing a single monolithic detector pixel forming part of a large, imaging focal plane array, that combines emitter-detector functionality at the micrometer scale, pixel level.

BRIEF SUMMARY OF THE INVENTION

The hurdles associated with realizing a highly compact, monolithic, all solid-state imaging focal plane array having high resolution, as well as passive and active imaging capability, can be overcome using an advanced silicon avalanche photodiode (APD) detector pixel that electrically and optically integrates a solid-state gallium nitride (GaN)/indium gallium nitride (InGaN) vertical-cavity surface-emitting laser (VCSEL) diode directly in each pixel.

The method for realizing such a compact emitter-detector pixel uses silicon-on-sapphire substrate material incorporating an epitaxially grown crystalline, quarter-wavelength aluminum nitride (AlN) antireflective layer between the silicon and R-plane oriented sapphire. This allows integration of a high quantum efficiency, back-illuminated, silicon APD with a GaN/InGaN laser diode in each pixel. The pixel design enables single photon sensitive, solid-state focal plane arrays (FPAs) supporting passive and active imaging capability in a single FPA.

When (100) silicon is properly etched with tetramethyl ammonium hydroxide (TMAH) solution, square based pyramidal frustum or mesa arrays result with the four mesa sidewalls of the APD formed by (111) silicon planes that intersect the (100) planes at a crystallographic angle $\phi_c$=54.7 degrees. The APD device is fabricated in the mesa using conventional silicon processing technology (e.g. thermal oxidation, diffusion of dopant impurities, deposition and metallization steps).

The GaN/InGaN laser diode is fabricated by epitaxial growth inside of an inverted, anisotropically etched, mesa frustum shaped cavity in the central interior region of the silicon mesa. Microlenses are fabricated in the thinned, and AR-coated sapphire substrate. Each emitter-detector pixel has a sapphire microlens aligned below the pixel footprint. The microlens has a dual function of shaping and relaying the VCSEL diode laser beam that exits through the sapphire substrate, and also of focusing optical returns from objects in a scene, into the silicon APD detector mesa.

The APDs share a common, front-side anode contact, and laser diodes share a common, front-side cathode contact across the array. A low resistance (Al) or (Cu) metal anode grid fills the space between pixels and also inhibits optical crosstalk. In each emitter-detector pixel, the silicon APD cathode terminal is electrically connected to the GaN/InGaN laser diode anode terminal using a metallization layer. This electrical connection is enabled by the close matching between the forward turn-on voltage of the GaN/InGaN laser diode (4-5 V) and the reverse silicon APD bias voltage (overbias) above the reverse avalanche breakdown voltage (4-5 V) in Geiger-mode. The emitter-detector pixel array is meant to be flip-chip bump-bonded to a CMOS readout integrated control circuit to form a hybridized, monolithic focal plane array imager.

The emitter-detector pixel can be operated in a passive imaging mode by setting the laser diode cathode terminal which is common with all other laser diode cathodes in the array to Vcc=5 V. This inhibits any lasing action from the emitter component of the pixels. The APDs can then be biased appropriately for either linear or Geiger-mode operation by setting the anode terminal which is common with all other APD detectors in the array to an appropriate voltage level to support either linear or Geiger-mode operation. The APD cathode terminals must not exceed a voltage bias value of Vcc=5 V to prevent switching on the lasers.

When imaging in an active mode, the laser diode in a pixel is meant to be switched on and off in alternating pattern with the APD. In one example of such operation, the laser diode is made to emit a short duration optical pulse while the APD detector in the pixel is switched off. The latter is accomplished by switching the APD anode terminal to ground (0 V) and also maintaining the laser diode cathode terminal at ground (0 V), while pulsing the laser diode anode terminal (which is electrically connected to the APD cathode terminal) to Vcc=5 V. When optical returns reflected from objects in a scene must be detected, the APD is switched on or gated on in Geiger-mode and the laser diode is inhibited. The latter is accomplished by setting the laser diode cathode terminal to Vcc=5 V and setting the APD anode terminal to a voltage 1-2 V below the reverse avalanche breakdown voltage while pulsing the APD cathode terminal, (electrically connected to the laser diode anode) to Vcc=5 V, thereby imposing an overbias on the APD.

In summary, an emitter-detector pixel consisting of a selectively etched silicon APD with electrically and optically integrated GaN/InGaN-VCSEL diode, enables a compact, monolithic, all solid-state imaging focal plane array that can be electronically switched between high-resolution, passive and active imaging modes. Thus, there is no need of any lasers and support electronics that are external to the focal plane array for active imaging, rather, all devices including laser light emitters and control electronics for them are solid-state and contained at the micrometer-scale, pixel level in the focal plane array imager.

BRIEF DESCRIPTION OF THE SEVERAL VIEWS OF THE DRAWING

These and other features of the subject of the invention will be better understood with connection with the Detailed Description of the Invention in conjunction with the Drawings, of which.

DETAILED DESCRIPTION OF THE INVENTION

Figure 1:
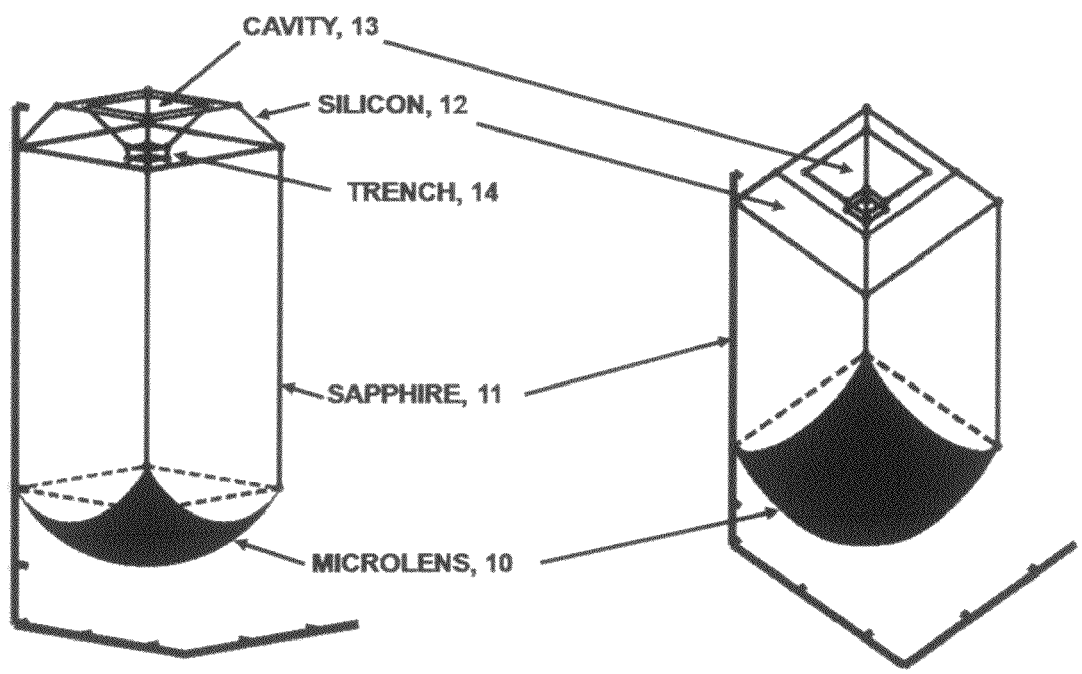
FIG. 1 provides a scale appropriate spatial rendering of the anisotropically etched 27 µm silicon APD pixel mesa with microlens, showing the inverted central mesa cavity for the GaN/InGaN-VCSEL diode.

Referring to FIG. 1, a true scale depiction of the emitter-detector pixel is shown with sapphire microlens 10, sapphire substrate 11, anisotropically etched silicon APD detector mesa 12 with anisotropically etched, inverted mesa frustum shaped interior cavity 13 for the GaN/InGaN-VCSEL diode emitter. Also shown, is the trench 14 etched in the sapphire substrate for the front-side distributed Bragg reflector (DBR) of the VCSEL.

Figure 2:
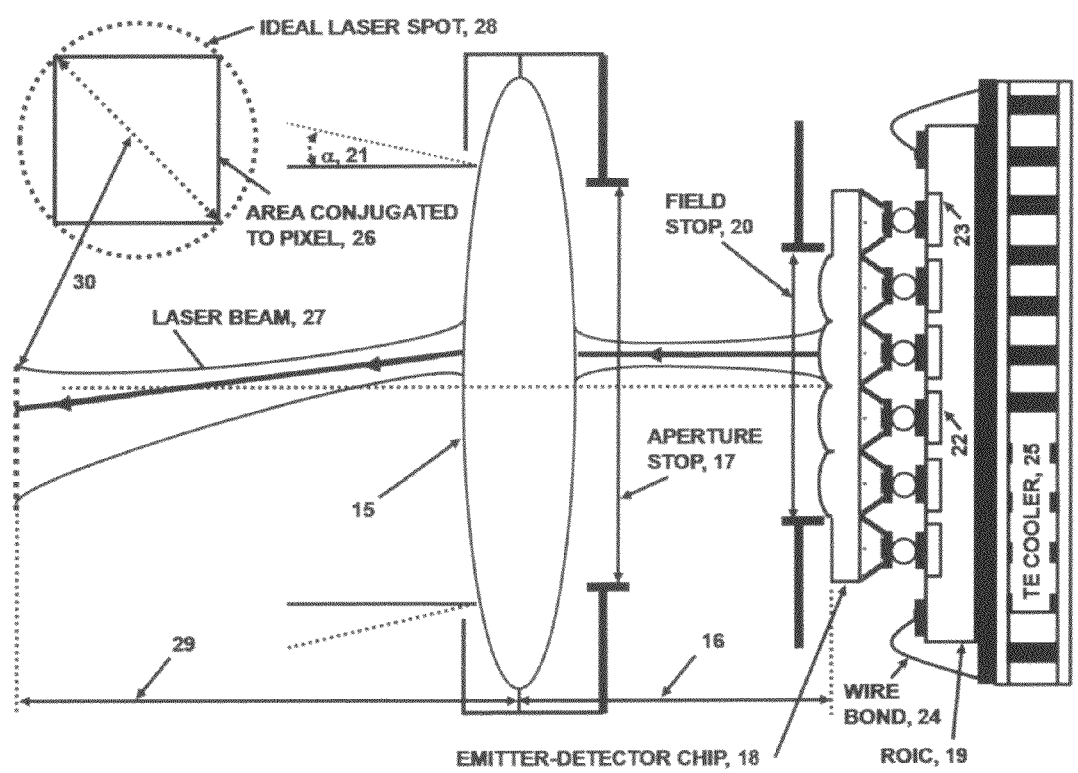
FIG. 2 illustrates the optimal diameter of a circular laser spot emitted by each 27 µm emitter-detector pixel of a focal plane array for a fixed distance to an object, to illuminate the square area in the scene, spatially conjugated back to the pixel using a camera lens.

Referring to FIG. 2, the principal advantage of fabricating a solid-state laser diode in each pixel of the APD focal plane array imager is depicted where a highly compact; monolithic, all solid-state optical radar can be realized by use of a simple camera lens 15 with focal length F=0.21 meters 16, an aperture stop of diameter D=7.8 cm 17 and a focal plane array (FPA) consisting of an emitter-detector pixel array chip 18 that is flip-chip bump-bonded to a CMOS readout integrated circuit (ROIC) 19. The light sensitive, square area of the FPA sets the field stop dimension 20, that in turn sets the angular field of view of the camera 21. The CMOS-ROIC 19 includes pixel circuits 22 and a top level metal anode ring 23 around the periphery of the pixel circuit array. The CMOS-ROIC 19 is shown wire bonded 24 to a ceramic interposer that is mounted to a thermoelectric cooler 25. The camera lens 15 allows the area in a scene 26 that is illuminated by the laser beam 27 in each pixel of the focal plane array comprised of emitter-detector pixels, to be spatially conjugated back to the detector containing the illuminating laser. The laser spot 28 at an object distance of 10,000 meters 29 has an ideal diameter of 1.81 meters 30 to illuminate the area 26 in the scene conjugated back to the pixel.

The approach presented here for implementing a highly compact, optical radar by electrically and optically integrating a GaN/InGaN-VCSEL diode emitter with each silicon APD detector at the pixel level to form a monolithic, all solid-state, high resolution passive or active 2-D or 3-D imaging focal plane array, is novel. The design approach presented here, represents a significant advancement in 3-D imaging and detection technology.

Figure 3:
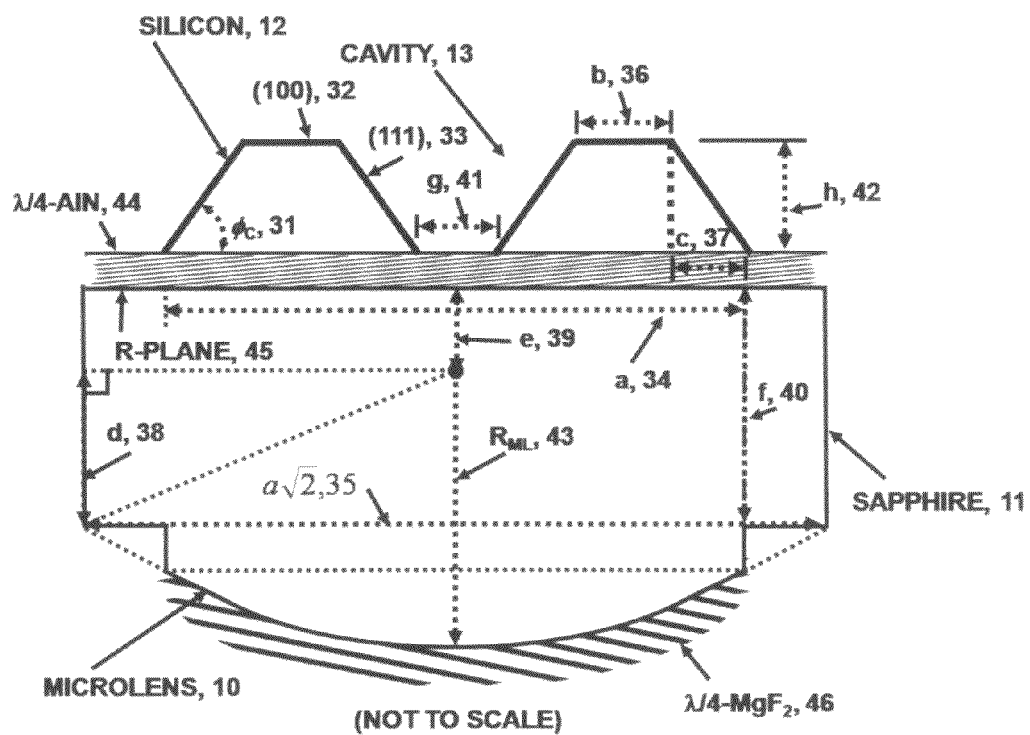
FIG. 3 is a diagrammatic cross-sectional illustration of a square 27 µm side length, emitter-detector pixel comprised of a back-illuminated, crystallographically etched, silicon-on-(R-plane) sapphire APD device with electrically and optically integrated GaN/InGaN-VCSEL diode for large-scale, high resolution, passive and active imaging focal plane arrays.

Referring now to FIG. 3, a cross section of the emitter-detector pixel is depicted, showing the anisotropically etched silicon pixel mesa frustum 12 with anisotropically etched, inverted mesa frustum shaped cavity 13 in the center of the silicon mesa, thereby providing space for fabricating the GaN/InGaN vertical-cavity surface-emitting laser (VCSEL) diode device in the center of the silicon pixel mesa. The anisotropically etched silicon pixel mesa 12 exhibits the characteristic angle $\phi_c$=54.7 degrees 31 between the (100) 32 and (111) 33 silicon planes. Dimensions of the pixel include square pixel side length 34 of a=27 µm, with corresponding diagonal dimension 35, b=3 µm 36, c=4.25 µm 37, d=10.93 µm 38, e=39.07 µm 39, f=50 µm 40, g=4 µm 41, h=6 µm 42, and microlens radius $R_{ML}$=22 µm 43. The avalanche photodiode (APD) detector is fabricated in the silicon mesa 12 to form a self-contained emitter-detector pixel while the GaN/InGaN-VCSEL diode is grown epitaxially in the center 13 of the silicon pixel mesa.

Important characteristics of the emitter-detector pixel include making use of a silicon-on-sapphire substrate material with a single crystal, epitaxially grown quarter-wavelength aluminum nitride (AlN) antireflective layer 44 between the silicon 12 and sapphire 11 having an R-plane orientation 45 that facilitates improved optical transmittance from sapphire into the silicon. At the air-sapphire interface, a quarter-wavelength magnesium fluoride ($MgF_2$) antireflective layer 46 can be deposited on the sapphire for improved optical transmittance from air into sapphire. Use of silicon-on-sapphire as a substrate is significant because it supports fabrication of a sapphire microlens 10 that performs two important functions for emitter-detector pixels.

Figure 4:
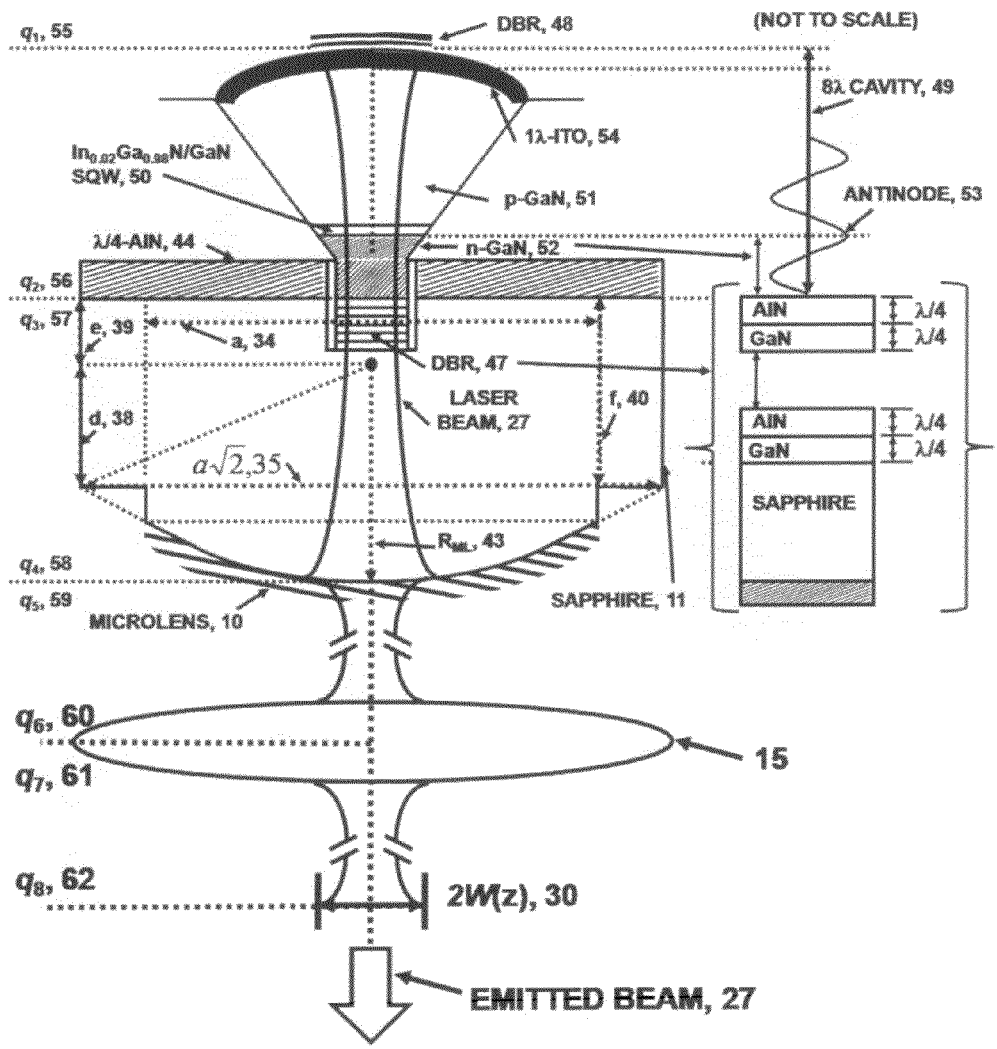
FIG. 4 illustrates one function of the sapphire microlens for the emitter-detector pixel, namely, to shape and collimate the laser beam emitted from the VCSEL through the sapphire substrate.

Referring now to FIG. 4, in the case of the emitter-detector pixel, the sapphire microlens 10 functions to shape and collimate the laser beam 27 emitted from the VCSEL through the sapphire substrate 11. An AlN antireflective layer 44 of 82 nm thickness increases optical transmittance into the silicon APD detector.

The geometry of the laser diode in each emitter-detector pixel reveals a reduced reflectance, planar, front-side, 20-pair AlN/GaN distributed Bragg reflector (DBR) mirror 47 and a high reflectance spherical, back-side, 20-pair $SiO_2$/$HfO_2$ distributed Bragg reflector (DBR) mirror 48 forming a laser resonator cavity 49 in the space between the DBRs.

A single quantum well (SQW) of 10 nm thickness, composed of InGaN material 50 is epitaxially grown between p-GaN 51 and n-GaN 52 material layers at an antinode 53 location of the resonator cavity. The single quantum well forms the active laser medium where electrons and holes recombine with high probability by radiative emission means. The composition of the $In_{0.02}Ga_{0.98}N$ material is tailored to support a lasing wavelength of $\lambda_0$=370 nm.

An indium tin oxide (ITO) transparent electrode 54 deposited on p-GaN 51 is used to form the anode electrical contact of the VCSEL diode.

Gaussian beam parameters $q_1$ 55, $q_2$ 56, $q_3$ 57, $q_4$ 58, $q_5$ 59, $q_6$ 60, $q_7$ 61, $q_8$ 62 can be calculated in order to optimize the spot diameter 2 W(z) 30 of the emitted laser beam 27 propagating from the pixel through the camera lens 15 to the scene, to illuminate the area 26 (in FIG. 2) conjugated back to the respective pixel. Among the critical dimensions of the pixel a 34, d 38, e 39, f 40 and microlens radius $R_{ML}$ 43 are repeated here from FIG. 3. One other critical pixel dimension remains the radius of curvature of the backside $SiO_2$/$HfO_2$ DBR 48 that should be 3.5 times the length of the laser cavity 49 to realize a near ideal laser spot diameter 30.

Figure 5:
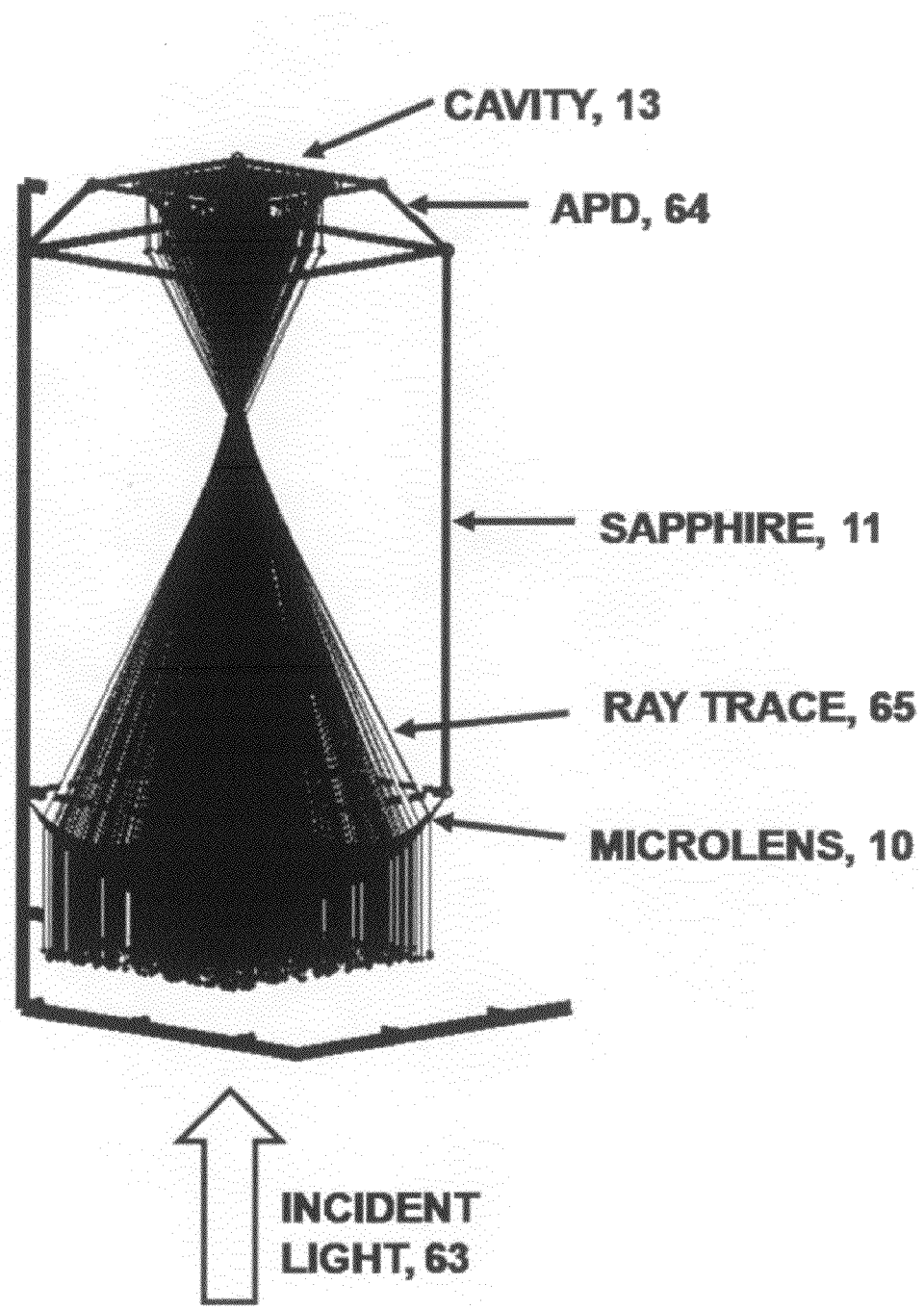
FIG. 5 is the calculated 3-D ray tracing for the emitter-detector pixel structure from FIG. 1 showing correct focusing by the sapphire microlens of optical k-vectors into the silicon mesa APD for light rays normally incident to the sapphire substrate plane.

Referring now to FIG. 5, the sapphire microlens 10 of each emitter-detector pixel also functions to collect and focus light 63 reflected from objects in a scene into the silicon APD detector 64 as calculated using 3-D ray tracing 65. The sapphire substrate 11 and selectively etched, inverted mesa frustum shaped cavity 13 are indicated in the figure.

Figure 6:
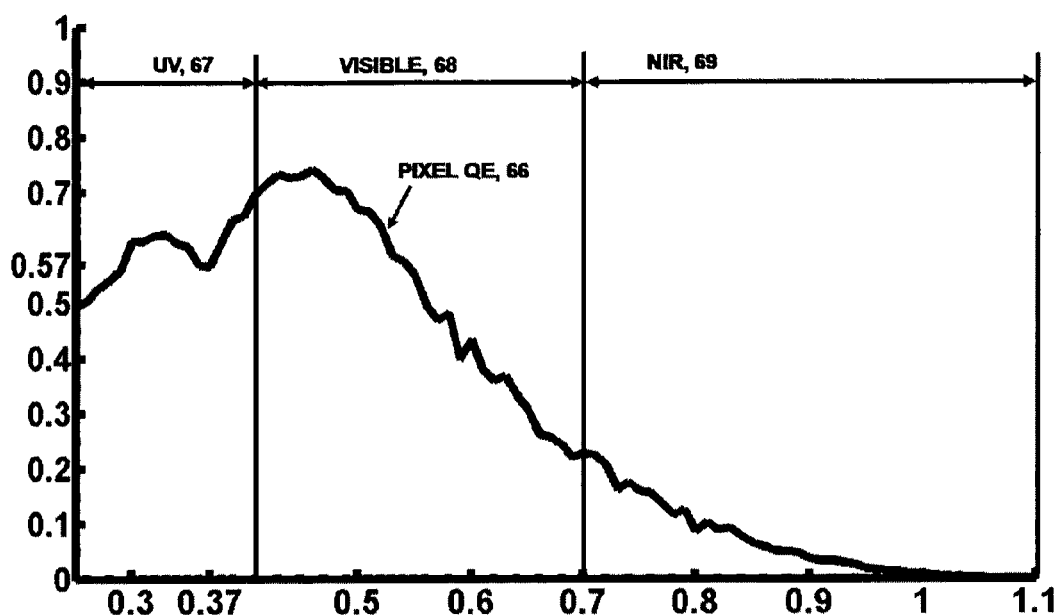
FIG. 6 is the calculated quantum efficiency of the 27 µm silicon mesa APD with optically and electrically integrated GaN/InGaN-VCSEL diode emitter shown in FIG. 1.

Referring now to FIG. 6, the quantum efficiency 66 of the silicon mesa APD detector with anisotropically etched cavity for VCSEL diode, is calculated using the 3-D ray tracing method depicted in FIG. 5. The result clearly shows a useful quantum efficiency in the ultraviolet 67, visible 68 and also to a lesser extent in the near infrared 69 part of the electromagnetic frequency spectrum.

Thus, the silicon-on-sapphire substrate by virtue of a microlens, supports effective pixel level optical integration of the silicon mesa APD detector with the GaN/InGaN-VCSEL diode at micrometer scales needed for high resolution, imaging focal plane arrays.

Figure 7:
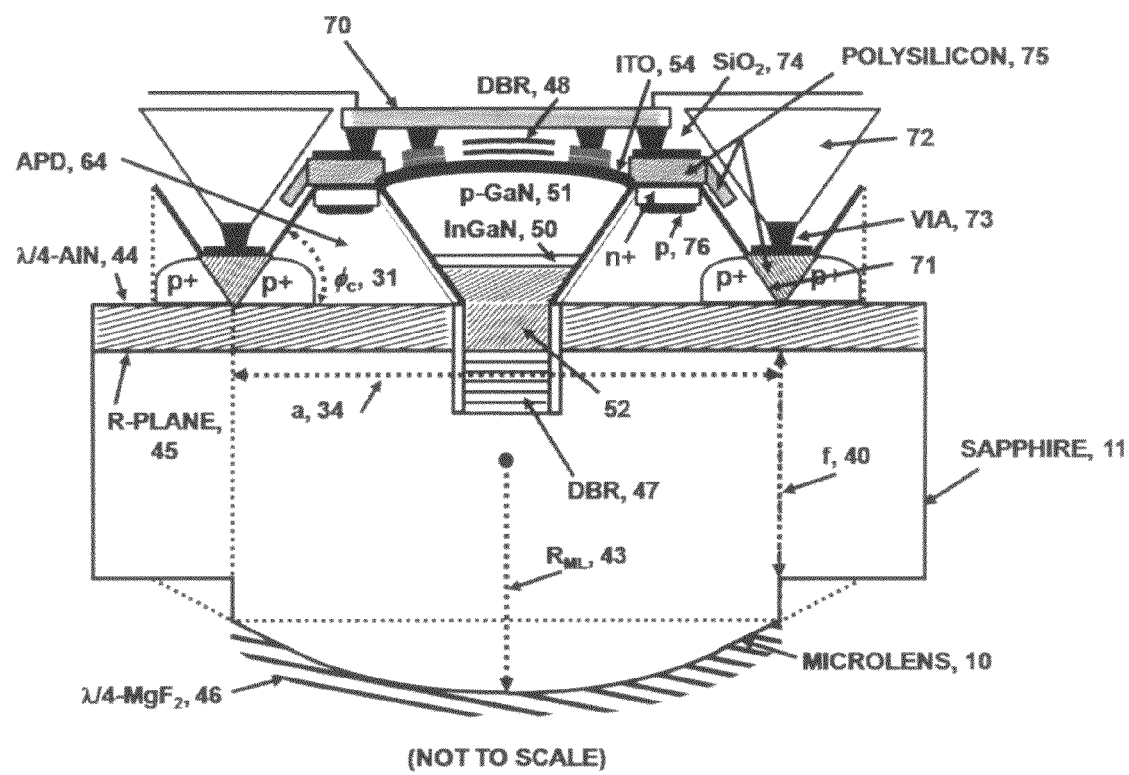
FIG. 7 illustrates the geometry of the laser diode structure in the emitter-detector pixel including the front-side AlN/GaN DBR and back-side $SiO_2$/$HfO_2$ DBR.

Referring to FIG. 7, electrical integration of the silicon mesa APD with a GaN/InGaN-VCSEL diode at the pixel level, is achieved by an electrical connection 70 between the cathode terminal of the APD and the anode terminal of the corresponding GaN/InGaN-VCSEL diode. This connection is supported by close matching between the turn-on voltage of the GaN/InGaN-VCSEL diode (4-5 V) and the silicon APD (also 4-5 V above the reverse avalanche breakdown voltage).

Silicon APD detectors share a common front-side anode contact 71, made locally at the base of each device mesa. A low resistance aluminum (Al) anode or copper (Cu) metal anode grid 72 fills the space between pixels and also functions to inhibit optical crosstalk by shielding adjacent detectors from stray photons generated during the avalanche process.

The GaN/InGaN-VCSEL diodes share a common, front-side cathode contact 52 across the entire array. The figure also shows the silicon APD mesa 64, sapphire substrate 11, R-plane surface of sapphire 45, AlN antireflective layer 44, sapphire microlens 10, $MgF_2$ antireflective layer 46, front-side AlN/GaN DBR 47, InGaN single quantum well 50, p-GaN 51, back-side $SiO_2/HfO_2$ DBR 48, microlens radius $R_{ML}$ 43, tungsten vias 73, ITO transparent electrical contact 54, $SiO_2$ electrical isolation layer 74, n+ and p+ doped APD cathode and anode polysilicon 75 respectively, p-type diffused high electric field APD avalanche region 76. Pixel dimensions a=27 μm 34, sapphire substrate thickness f=50 μm 11 and crystallographic angle $\phi_c$=54.7 degrees 31 are also shown.

Figure 8:
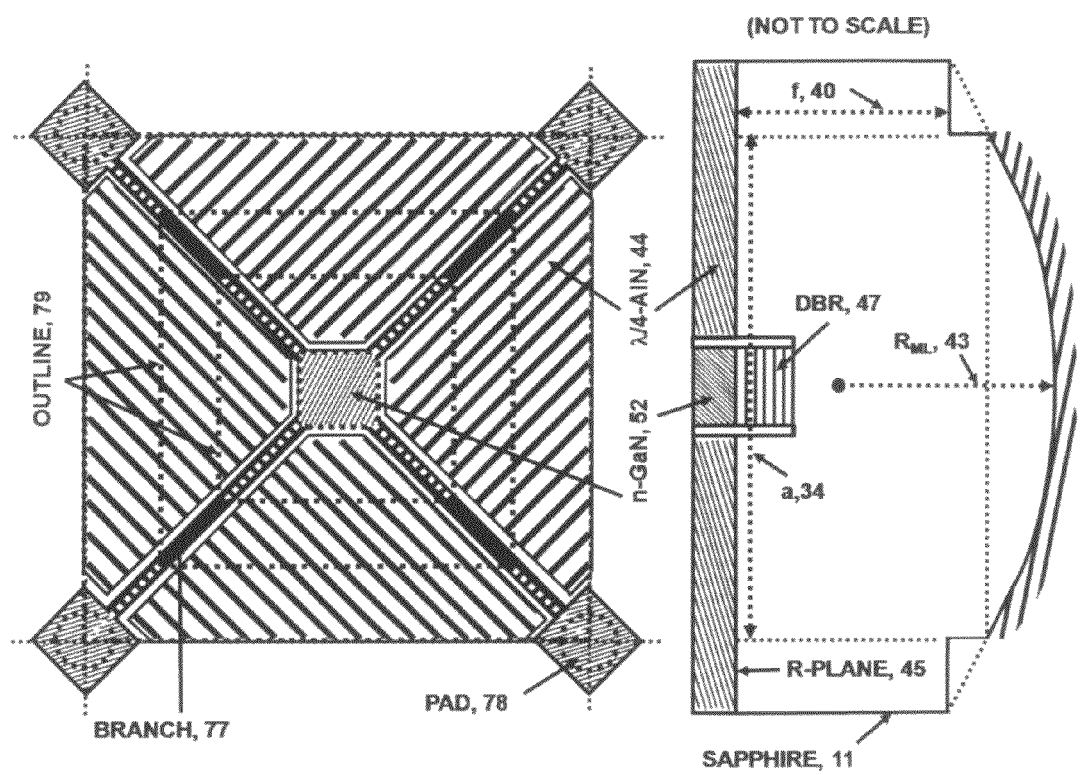
FIG. 8 illustrates the n-doped GaN laser diode cathode which is epitaxially grown on the front-side DBR and sapphire substrate.

Referring now to FIG. 8, the emitter-detector pixel is shown from a top view on the left and in cross-section on the right. The laser diode cathode in each pixel consists of n-doped GaN 52, epitaxially grown on top of the front-side, 20-pair AlN/GaN DBR mirror 47, to the same height as the 82 nm thick AlN antireflective layer 44. The AlN antireflective layer is grown on the R-plane 45 of the sapphire substrate 11. The n-doped GaN cathode 52 of the VCSEL diode has four branching arms 77 that extend to larger pads 78 located at the four corners of the pixel, thereby supporting a shared cathode terminal for all laser diodes in the emitter-detector pixel array when such pixels are abutted. The figure also shows the outline of the top of the silicon pixel mesa 79. Pixel dimensions a=27 μm 34, sapphire substrate thickness f=50 μm 40, and microlens radius $R_{ML}$=22 μm 43 are also shown.

Figure 9:
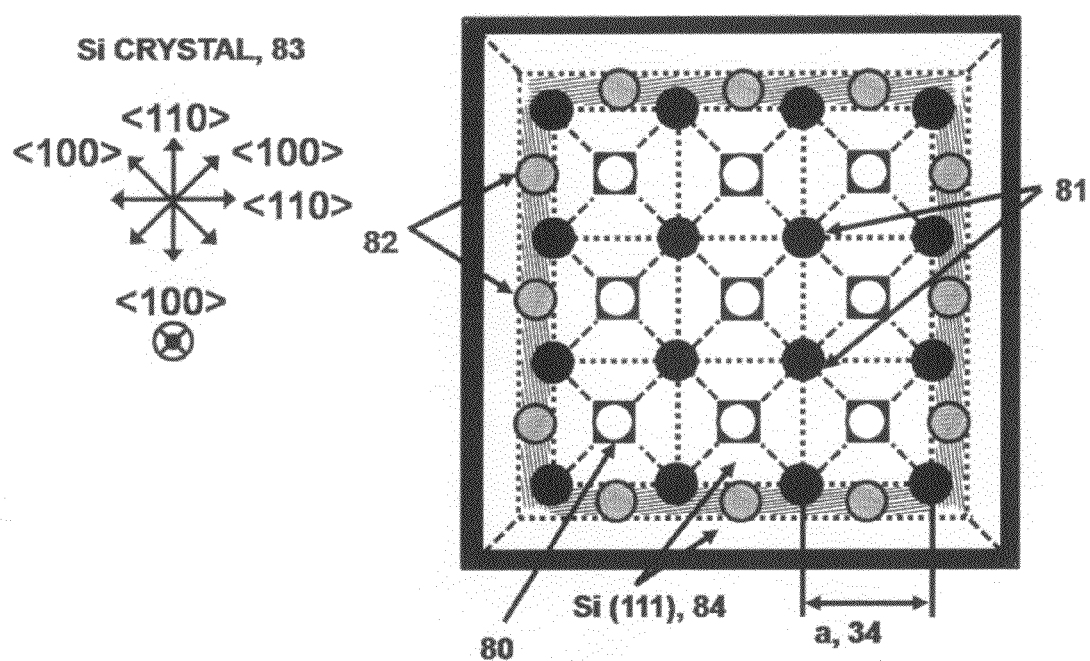
FIG. 9 illustrates the top view of an example 3×3 pixel emitter-detector chip showing the placement of indium metal contact spheres or bumps for electrical connectivity. The APD common anode, laser diode common cathode, and the individual pixel terminals (having electrically connected APD cathodes and laser diode anodes), are accessed from the front-side of the emitter-detector pixel array.

Referring to FIG. 9, an example 3×3 pixel emitter-detector chip is shown from a top view, depicting placement of indium spherical bumps for electrical connectivity. Clear circles 80 represent pixel contacts, filled circles 81 represent VCSEL diode common cathode contacts and hashed circles 82 represent the APD common anode contact ring around the pixel array periphery. Also shown for reference are the silicon crystallographic directions 83, the Si (111) planes 84, pixel pitch a=27 μm 34.

Figure 10:
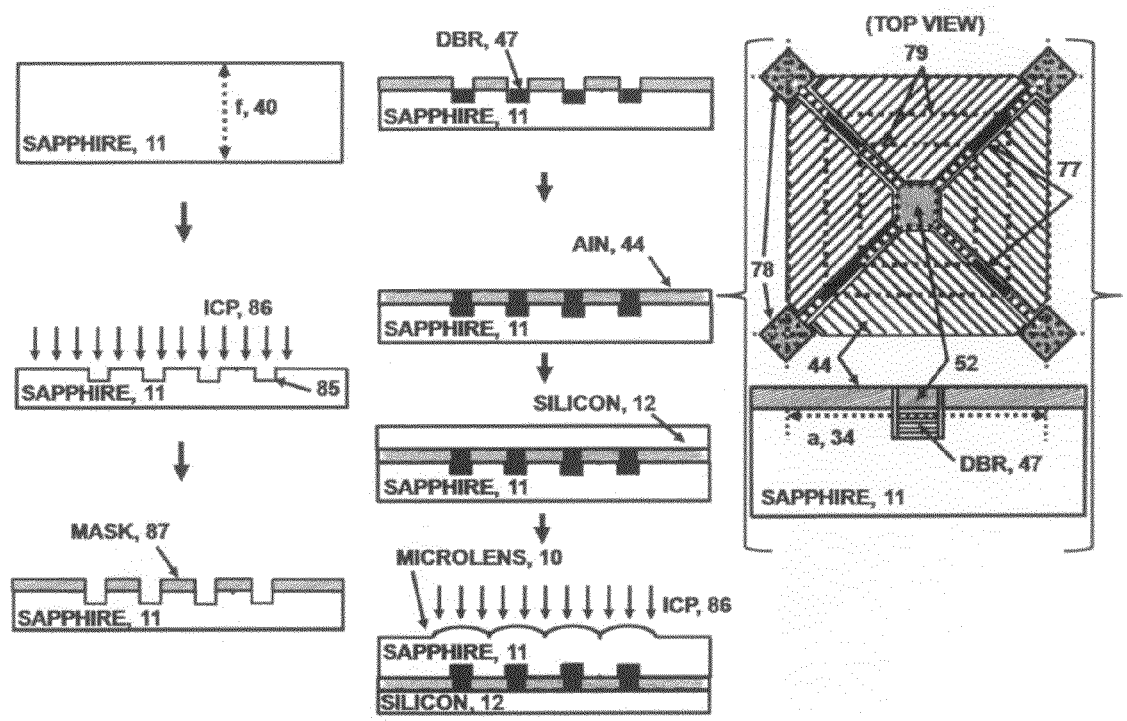
FIG. 10 shows the fabrication method sequence of steps for the emitter-detector pixel array up to the anisotropic etching step of the silicon mesa array and before fabrication of the VCSELs or APDs.

Referring to FIG. 10, the fabrication process for the emitter-detector pixel array is depicted up to and including the fabrication of the sapphire microlens array and before the anisotropic etching step of the silicon mesa array and the subsequent fabrication of the VCSELs or APDs. In one embodiment of emitter-detector pixel array fabrication, the starting sapphire wafer substrate 11 is thinned by lapping and polishing means to thickness f=61 micrometers 40. Front-side, square trenches of 4 μm side length 85 are lithographically patterned and etched to a depth of 1.58 μm in the sapphire substrate by means of inductively coupled plasma (ICP) 86. A silicon dioxide ($SiO_2$) hard mask 87 for selective epitaxial growth is deposited on the sapphire 11 and lithographically patterned to permit growth of the 20-pair front-side AlN/GaN DBR mirror 47 for the VCSEL laser. The $SiO_2$ selective growth mask is then etched off to permit growth of the AlN antireflective layer 44 by epitaxy to 82 nm thickness.

The AlN is lithographically patterned and etched to clear room for selective epitaxial growth of the n-GaN VCSEL cathode terminal 52 with diagonally branching arms 77 and contact pads 78 at the four pixel corners. The n-GaN VCSEL cathode terminal is grown to the same 82 nm height as the AlN antireflective layer.

The n-GaN VCSEL cathode terminal 52 is grown by epitaxy, directly on top of the front-side AlN/GaN DBR 47 which is flush with the sapphire substrate 11 surface. Therefore, the diagonally branching n-GaN arms 77 and contacts pads 78 of the VCSEL cathode grow epitaxially on the sapphire substrate.

An epitaxial silicon wafer 12 is bonded to the processed sapphire wafer and subsequently thinned by lapping and polishing to an optimal 6 μm silicon device thickness.

The sapphire microlens array 10 is lithographically patterned and etched by means of inductively coupled plasma (ICP) 86. The pixel pitch, a=27 μm 34 is shown for reference.

Figure 11:
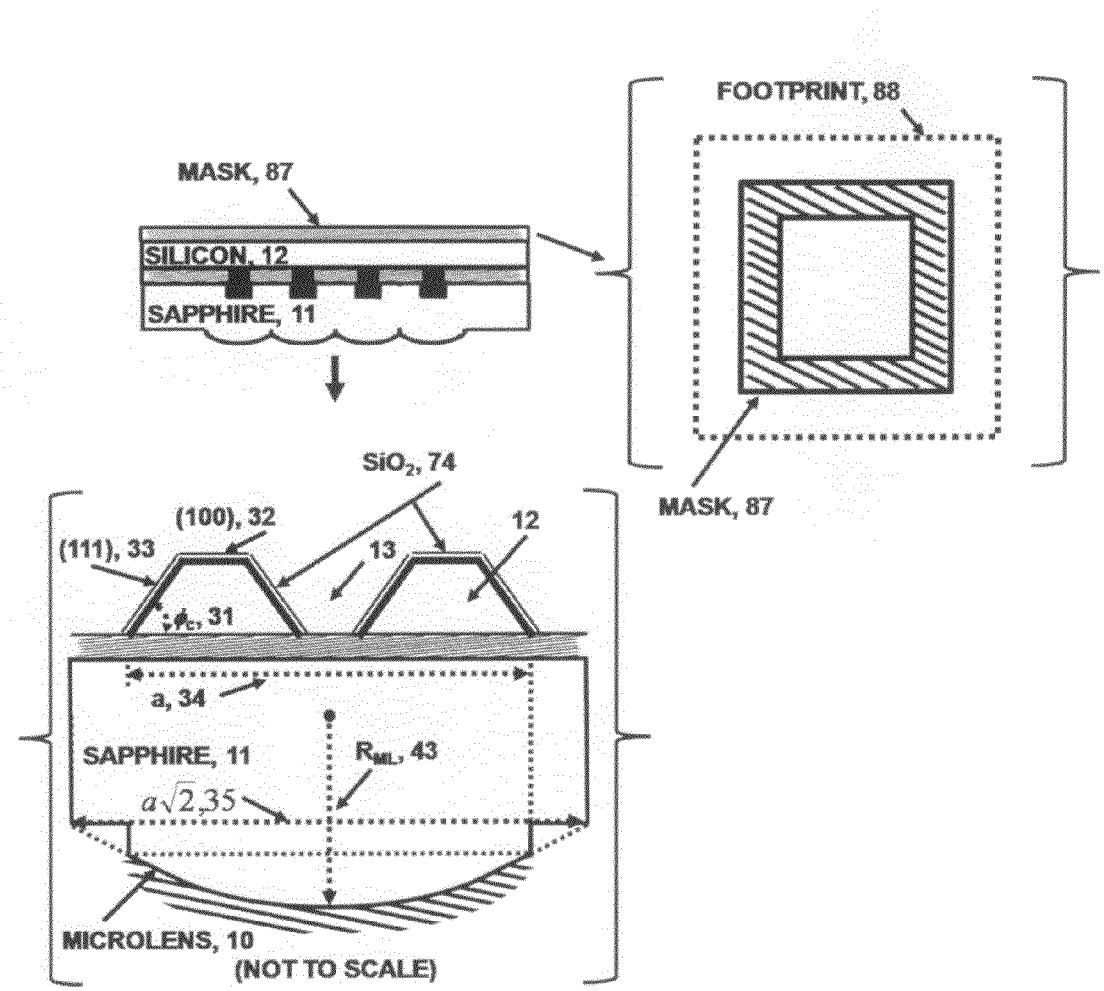
FIG. 11 shows the electrical isolation method by which the GaN/InGaN-VCSELs can fabricated independently of the silicon APDs.

Referring to FIG. 11, the silicon pixel mesa array with central, inverted pyramidal frustum shaped cavities in each pixel for VCSEL diode emitters is anisotropically etched through a hard $SiO_2$ etch mask 87. The top view of one embodiment of the pixel mesa $SiO_2$ etching mask is shown on the right including the pixel footprint outline 88.

Once silicon pixel mesas have been anisotropically etched, the array of silicon emitter-detector pixel mesas is thermally oxidized 74 on all exposed planes 32, 33 to electrically isolate the silicon 12 of the APD detector device from the GaN/InGaN-VCSEL that will be grown epitaxially in the etched interior cavity 13 of the silicon APD detector mesa.

Thermal oxidation of the silicon pixel mesas is an effective means of passivating and electrically isolating the APD detector devices from the GaN/InGaN-VCSEL devices, thereby, allowing optimal processing conditions to be applied in fabricating each device separately from the other. Only near the end of the fabrication of both devices, during backend processing, is the electrical connection between the APD cathode and VCSEL diode anode implemented to form the individual pixel contacts 70 (in FIG. 7).

Figure 12:
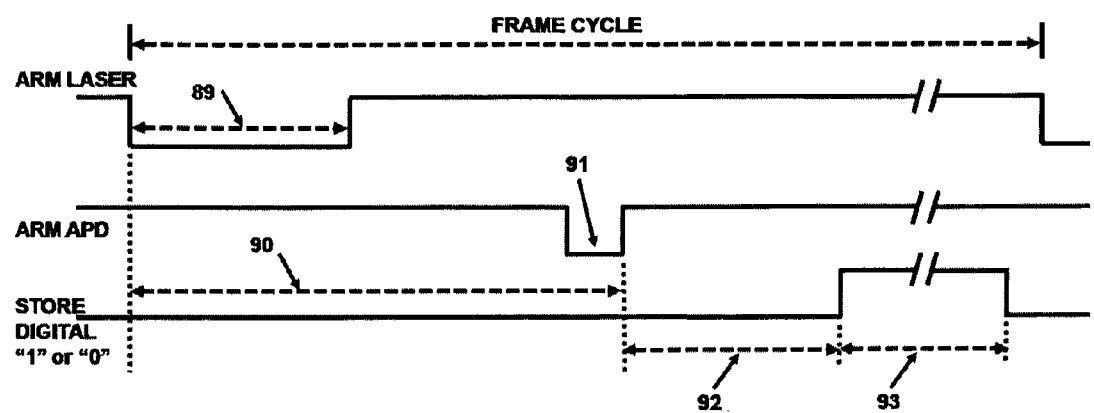
FIG. 12 is an example timing diagram depicting operation of the emitter-detector pixel and focal plane array in active mode for measuring the distances of objects in a scene.

Referring to FIG. 12, operation of the emitter-detector pixel in active detection mode is illustrated. The laser diode in the pixel is triggered 89 to emit a 200 ns duration optical pulse toward an area in a scene. This is accomplished by first switching off the APDs by setting the common anode terminal 72 (in FIG. 7) to ground (0 V) and switching the anode terminal 70 (in FIG. 7) of the VCSEL diode to an on-state voltage of 4-5 V. After a set time delay 90 of 66.7 μsec corresponding to when optical returns reflected from an object located at a distance of 10,000 meters must be detected, the APDs are switched on 91 while the laser diodes are turned off. This is accomplished by switching off the VCSEL diodes in the array by setting the common cathode terminal 52 (in FIGS. 7) to 5 V followed by setting the common anode terminal of the APDs 72 (in FIG. 7) to a voltage 1-2 V below the reverse avalanche breakdown voltage. The APD detector is gated-on by pulsing the cathode terminal 70 (in FIGS. 7) to 5 V. The gate-on time duration 92 of the APD detector determines the range depth resolution for objects in a scene. The binary value read out from the pixel during the readout time interval 93 indicates whether a return photon has been detected (digital "1") or not (digital "0").

Operating the emitter-detector pixel in active mode by alternately turning on and off the GaN/InGaN laser and the APD detector, requires the common cathode terminal of the laser diodes and common anode terminal of the APDs to be independently accessible to the electronic control circuitry of the focal plane array as depicted in FIG. 9.

Operation of the emitter-detector pixel in passive detection mode is accomplished by switching off all VCSEL diodes in the array using the procedure already described in paragraph [0062]. The APD detectors in the array might then be operated in a conventional, staring, passive 2-D imaging mode without active laser illumination of the scene.

In summary, a novel method for implementing a compact, all solid-state, emitter-detector pixel with electronically selectable, passive or active detection mode, for large-scale, high resolution, focal plane arrays has been presented and described. The said emitter-detector pixel design would enable for the first time, a monolithic, optical radar integrated on a chip. Hitherto, it was necessary to have the laser light source as a physically separate entity from the detector focal plane array, in active 3-D LADAR imaging systems. That limitation in the design of compact 3-D LADAR imaging systems has been overcome with the novel, compact, all solid-state, emitter-detector pixel design presented here, for implementing high resolution, large-scale, passive and active imaging focal plane arrays.

The invention claimed is:

1. An all solid-state imaging apparatus for measuring ultraviolet, visible and near infrared radiation reflected or emitted from objects in a scene and for emitting coherent ultraviolet laser light to illuminate any single point in the scene one at a time or, to illuminate any arbitrary combination of said single points or separate arbitrary groups of said single points in the said scene at one time or, to illuminate all said single points in unison, whereby each said single point illuminated in said scene is known exactly to be spatially conjugated to a single corresponding detector element in the focal plane or image plane of said all solid-state imaging apparatus, comprising:
   a monolithic emitter-detector focal plane array (FPA), wherein said monolithic emitter-detector focal plane array (FPA) comprises emitter-detector device elements (pixels), detecting radiation in the ultraviolet, visible and near infrared, and also emitting collimated ultraviolet radiation, in a direction orthogonal to said monolithic emitter-detector focal plane array (FPA); and
   a monolithic readout integrated circuit (ROIC), electrically connected to said monolithic emitter-detector focal plane array (FPA) for providing control signals to said emitter-detector device elements (pixels) of said monolithic emitter-detector focal plane array (FPA), thereby permitting any single said emitter-detector device element (pixel) or any arbitrary combination of said emitter-detector device elements (pixels) or separate arbitrary groups of said emitter-detector device elements (pixels) or, all said emitter-detector device elements (pixels) in unison within the said monolithic emitter-detector focal plane array (FPA) to emit light or to detect light at one time; and
   a stationary optical system for each said emitter-detector device element (pixel) of said monolithic emitter-detector focal plane array (FPA) that collimates the light emitted from any single said emitter-detector device element (pixel) within said monolithic emitter-detector focal plane array (FPA) and directs said light to the point in the scene spatially conjugated by said stationary optical system, back to said emitter-detector device element (pixel) emitting said light.

2. The apparatus of claim 1, wherein each of said emitter-detector device elements (pixels) comprises:
   a silicon diode region for detecting ultraviolet, visible and near infrared photons, wherein said silicon diode region has been anisotropically etched as a pyramidal mesa frustum having a central inverted pyramidal mesa frustum cavity space and wherein said silicon diode region bounded on all 8 sloped sides by (111) planes and bounded on horizontal top and bottom sides by (100) planes; and
   a gallium nitride (GaN)/indium gallium nitride (InGaN) laser diode emitter region for emitting ultraviolet coherent light at a fixed wavelength ($\lambda$) in a direction orthogonal to said monolithic emitter-detector focal plane array (FPA), wherein said GaN/InGaN laser diode emitter region occupies said anisotropically etched central inverted pyramidal mesa frustum cavity space of said pyramidal mesa frustum.

3. The apparatus of claim 2, wherein each said silicon diode region is square in cross-section and wherein the side length of said square cross-section is 27 micrometers.

4. The apparatus of claim 2, wherein each said silicon diode region has height of 6 micrometers.

5. The apparatus of claim 2, wherein each said silicon diode region comprises a silicon avalanche photodiode (APD) structure and wherein said silicon avalanche photodiode (APD) structure quantum efficiency is 57% at wavelength $\lambda=370$ nanometers and said silicon avalanche photodiode (APD) structure quantum efficiency is greater than 20% for $400<\lambda<700$ nanometers.

6. The apparatus of claim 2, wherein each said GaN/InGaN laser diode emitter region comprises a GaN/InGaN vertical-cavity surface-emitting laser (VCSEL) diode structure and wherein said GaN/InGaN vertical-cavity surface-emitting laser (VCSEL) diode structure emits light at a wavelength of 370 nanometers.

7. The apparatus of claim 1, wherein said monolithic emitter-detector focal plane array (FPA) comprises electric terminals for the control of said emitter-detector device elements (pixels), said electric terminals comprising:
   a global common cathode terminal for biasing all emitters in said monolithic emitter-detector focal plane array (FPA); and
   a global common anode terminal for biasing all detectors in said monolithic emitter-detector focal plane array (FPA); and
   a local terminal in each said emitter-detector device element (pixel), wherein the detector cathode in said emitter-detector device element (pixel) is electrically connected to said local terminal, and wherein the emitter anode is electrically connected to said local terminal.

8. The apparatus of claim 1, wherein said monolithic emitter-detector focal plane array (FPA) includes a silicon-on-sapphire wafer substrate, wherein said silicon-on-sapphire wafer substrate includes an aluminum nitride (AlN) antireflective layer disposed between silicon and sapphire.

9. The apparatus of claim 1, wherein said stationary optical system comprises: a monolithic microlens array coupled to said monolithic emitter-detector focal plane array (FPA), wherein a single microlens of said monolithic microlens array collimates said light emitted from each said emitter-detector device element (pixel) of said monolithic emitter-detector focal plane array (FPA) and focuses light impinging on each said emitter-detector device element (pixel) of said monolithic emitter-detector focal plane array (FPA); and a convex lens that, for each said emitter-detector device element (pixel) of said monolithic emitter-detector focal plane array (FPA), directs said light emitted from any single said emitter-detector device element (pixel) within said monolithic emitter-detector focal plane array (FPA) to the point in said scene spatially conjugated by said convex lens back to said emitter-detector device element (pixel) emitting said light.

* * * * *